United States Patent [19]

Nagumo et al.

[11] Patent Number: 5,087,938
[45] Date of Patent: Feb. 11, 1992

[54] IMAGE RECORDING APPARATUS

[75] Inventors: Akihiko Nagumo; Yuji Nishio, both of Kanagawa, Japan

[73] Assignee: Fuji Photo Film Co., Ltd., Kanagawa, Japan

[21] Appl. No.: 361,013

[22] Filed: Jun. 2, 1989

[30] Foreign Application Priority Data

| Jun. 3, 1988 | [JP] | Japan | 63-137102 |
| Jun. 3, 1988 | [JP] | Japan | 63-137104 |
| Dec. 27, 1988 | [JP] | Japan | 63-329607 |
| Dec. 27, 1988 | [JP] | Japan | 63-329608 |

[51] Int. Cl.$^5$ .................. G03B 27/72; G03B 27/52
[52] U.S. Cl. ........................ 355/27; 355/69; 355/70
[58] Field of Search ............... 355/27–29, 355/68–71, 77; 430/211, 138

[56] References Cited

U.S. PATENT DOCUMENTS

| 4,482,624 | 11/1984 | Arney et al. | 430/138 |
| 4,639,127 | 1/1987 | Beery et al. | 355/71 X |
| 4,910,550 | 3/1990 | Ohashi et al. | 355/27 |
| 4,943,826 | 7/1990 | Ohashi et al. | 355/27 |
| 4,952,969 | 8/1990 | Hara | 355/27 |

FOREIGN PATENT DOCUMENTS

| 0210660 | 2/1987 | European Pat. Off. |
| 0220746 | 5/1987 | European Pat. Off. |
| 57-179836 | 11/1982 | Japan |
| 58-149046 | 9/1983 | Japan |
| 58-149047 | 9/1983 | Japan |
| 59-152440 | 8/1984 | Japan |
| 59-154445 | 9/1984 | Japan |
| 59-165054 | 9/1984 | Japan |
| 59-168439 | 9/1984 | Japan |
| 59-174832 | 10/1984 | Japan |
| 59-174833 | 10/1984 | Japan |
| 59-174834 | 10/1984 | Japan |
| 59-174835 | 10/1984 | Japan |
| 59-180548 | 10/1984 | Japan |
| 61-23245 | 1/1986 | Japan |
| 61-275742 | 12/1986 | Japan |
| 61-278849 | 12/1986 | Japan |
| 62-65038 | 3/1987 | Japan |
| 62-209444 | 9/1987 | Japan |

Primary Examiner—L. T. Hix
Assistant Examiner—D. Rutledge
Attorney, Agent, or Firm—Sughrue, Mion, Zinn, Macpeak & Seas

[57] ABSTRACT

An image recording apparatus which uses one type of photo-sensitive material to transfer an image from a original having a different density scale. The original image is given a primary exposure to the photo-sensitive material and the photo-sensitive material is given a direct exposure as an auxiliary exposure. After a certain amount of auxiliary exposure has been performed, the ratio of the amount of auxiliary exposure with respect to the amount of the total exposure of the part on the photo-sensitive material corresponding to the high density part of the original, is small, but because the ratio with respect to the amount of the total exposure of the part on the photo-sensitive material corresponding to the low density part of the original is large, the apparent γ-characteristics of the photo-sensitive material is lowered, and a favorable image corresponding to the gradation of the original can be obtained.

23 Claims, 8 Drawing Sheets

IMAGE RECORDING APPARATUS

BACKGROUND OF THE INVENTION

The present invention relates to an image recording apparatus in which an original is illuminated with light from a light source and the light either reflected from the original or passing through the original is transferred onto a photo-sensitive material, so that an image on the original is exposed and recorded on the photo-sensitive material.

DESCRIPTION OF THE RELATED ART

A known type of image recording apparatus illuminates an original or a manuscript with light from a light source and transfers the light rays either reflected from or passing through the original, to expose and record an image of the original.

This type of image recording apparatus is provided with a light sburce and a lens optical system, which are movable along the original. When images of such an original as an original film or other originals are exposed, the light source which is emitting the light and part of the lens optical system move along the original, i.e., the light emitted illuminates along the original, and the image light either reflected from or passing through the original is projected to the photo-sensitive material which is being conveyed through the lens optical system, so that a scanning exposure is conducted. However, the image of the original recorded on the photo-sensitive material has a different gradation depending upon what type of original is used, and so it is preferable to select the photo-sensitive material in accordance with the type of original. For example, in the case of original such as a printed original and a text original in which the density changes intermittently, if a photo-sensitive material having a hard gradation characteristic where a so-called γ value to high is used, it is put in a favorable state of exposure and a resultant favorable copied image is obtained. Furthermore, in the case of a original such as a photograph in which the density changes continuously, if a photo-sensitive material having a soft gradation whare the γ value is low is used, it is put in a favorable state of exposure and a resultant favorable copied image is obtained.

SUMMARY OF THE INVENTION

In conventional image recording apparatus, the image of the original is exposed to the photo-sensitive material by the light emitted from a single light source, and the characteristics of the photo-sensitive material to be used are uniform. Because of this, there is a fixed variation in the amount of exposure with respect to dark and light parts of the original, irrespective of the gradation of the original image. This means that depending upon the original image, there are instances where a favorable exposure may not be obtained. Furthermore, in order to eliminate this problem, it is necessary to prepare a photosensitive material having different characteristics in accordance with the gradation of the original image, and to exchange the photo-sensitive material. In addition to making the entire apparatus large, exchanging the photosensitive material is a troublesome operation.

In view of these above-described problems, an object of the present invention is to provide an image recording apparatus that can perform favorable exposure in accordance with the gradation of the original image and irrespective of the characteristics of the photo-sensitive material.

To this end, the image recording apparatus of the invention for recording an image of an original to a photo-sensitive material having predetermined characteristics, is provided with a primary exposure means and an auxiliary exposure means. The primary exposure means is provided with a light source and performs primary exposure of the image of the original to the photo-sensitive material by the light illuminated from the light source. The auxiliary exposure means performs auxiliary exposure by exposing the photo-sensitive material by an exposure amount in accordance with the type of the original.

In the image recording apparatus having the above configuration, the light from the primary exposure means is illuminated to the original, and the light either reflected from or passing through the original is illuminated to the photo-sensitive material so that the image of the original is exposed to the photo-sensitive material.

Then, the light from the auxiliary exposure means is Because of this, the light component to expose the image of the original illuminated from the primary exposure means is held as it is, and only the amount of exposure of the photo-sensitive material changes. The auxiliary exposure means performs auxiliary exposure by an exposure amount in accordance with the type of original, or rather, the gradation of the original image. Therefore, the characteristics of the photo-sensitive material can be set to correspond to the gradation of the original image, and favorable exposure in accordance with the original image can be performed. For example, if a photosensitive material having characteristics corresponding to an original with an intermittent gradation is used, an image with a continuous gradation can be obtained by a predetermined amount of the auxiliary exposure.

The primary exposure is performed by slit scanning exposure. In the slit scanning exposure, the photo-sensitive material is conveyed by a conveying means, and when it is being conveyed, the image light for the image exposure is illuminated to expose the image of the original by the primary exposure means, and the image is recorded, that is, the primary exposure is conducted. When the slit scanning exposure is performed, either prior to or after the exposure of the image of the original, the photo-sensitive material is conveyed by the conveying means and while it is being conveyed, the light from the secondary exposure means is directly illuminated to the photo-sensitive material, i.e., the auxiliary exposure is carried out. Therefore, the photo-sensitive material has the image of the original exposed (while the light component for the image exposure is held as it is) and a change made for only the amount of exposure of the photo-sensitive material.

Here, the speed of conveyance of the photo-sensitive material by the conveying means can be changed and so either prior to or after the exposure of the image of the original, it is possible to change the speed of conveyance in accordance with the gradation of the original image when the light is illuminated on to the photo-sensitive material by the auxiliary, exposure means, i.e., when auxiliary exposure is performed, and therefore change only the amount of exposure of the photo-sensitive material to set the characteristics of the photo-sensitive material so that they correspond to the gradation of the original image, and so that a favorable exposure corresponding to the original image is performed.

In this invention, the photo-sensitive material can be one the latent image obtained by exposure is converted to a visible one by processes of developing, transfer and fixing, etc.

For example, silver halide photo-sensitive materials used for black and white photography, photo-sensitive materials for X-ray photographs, photo-sensitive materials for printing processes, conventional color photography photo-sensitive materials (negative film, reversal film, color print film, etc.), color dispersed transfer photo-sensitive material, heat-developable photo-sensitive materials or light- and pressure-sensitive materials can be used as the photo-sensitive material. The above-described heat-developable photo-sensitive material is disclosed in U.S. Pat. Nos. 4,463,079; 4,474,867; 4,478,927; 4,507,380; 4,500,626 and 4,483,914; Japanese Patent Laid-Open Nos. 149,046/1983; 149,047/1983; 152,440/1984; 154,445/1984; 165,054/1984; 180,548/1984; 168,439/1984; 174,832/1984; 174,833/1984; 174,834/1984; 174,835/1984; 65,038/1987 and 23,245/1986; and in European Patent Laid-Open No. 210,660A2 and 220,746A2.

Furthermore, the pressure-sensitive material is disclosed in Japanese Patent Laid-Open Nos. 179,836/1982; 275,742/1986; 278,849/1986 and 209,444/1987.

According to the present invention, an photo-sensitive material having predetermined characteristics can be used with the amount of auxiliary exposure adjusted so that a suitable image of an original having a different gradation is copied, thereby allowing favorable exposure corresponding to the gradation of the original image, to be performed using only one type of photo-sensitive material.

DESCRIPTION OF THE PREFERRED EMBODIMENT

Figure 1:
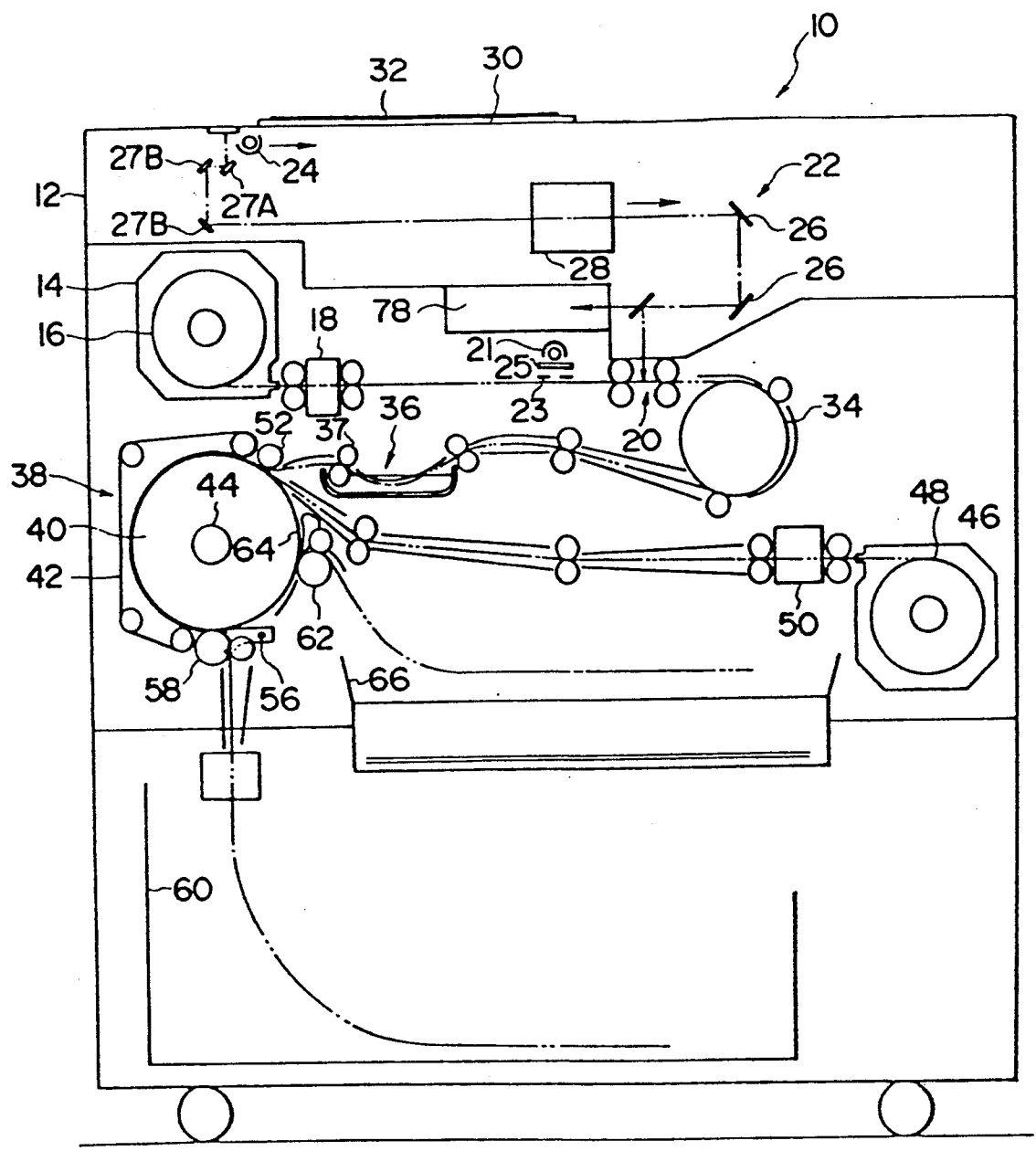
FIG. 1 is a schematic view of a first embodiment according to the present invention.

FIG. 1 is a schematic view of an image recording apparatus 10 according to a first embodiment of the present invention.

Provided in a frame base 12 of the image recording apparatus 10 is an photo-sensitive material magazine 14 in which is stored a roll of photo-sensitive material 16. The photo-sensitive material 16 has photosensitive silver halide, binder, color-supply materials and a reduction agent on a supporting body.

On the photo-sensitive material outlet side of the photo-sensitive material magazine 14 is disposed a cutter 18. This cutter 18 cuts the required length of photo-sensitive material 16 that has been drawn out of the photo-sensitive material magazine 14. The cut photo-sensitive material 16 is then conveyed to the exposure part 20.

Above the exposure part 20 is disposed an exposure device 22 as the main exposure means. In the exposure device 22 are disposed a light source 24, a plurality of fixed mirrors 26, movable mirrors 27A and 27B, and a lens unit 28, and above these parts is provided the platen 30 on the top of the base 12. The light source 24 and the movable mirrors 27A and 27B are movable along the length of the platen 30, and the light from the light source 24 is directly illuminated to an original, or a manuscript, 32. When there is primary exposure, the light source 24 and the movable mirror 27A are moved together while the movable mirror 27B is moved at a speed one half that of the light source 24 and the movable mirror 27A, and the light from the light source 24 is illuminated along the length of the original 32, and the lens unit 28 is used to project the reflected image light so as to perform scanning exposure of the photo-sensitive material 16 passing through the exposure part 20. By moving the movable mirror 27B at a speed one half that of the light source 24, it is possible for the length of the optical path from the original 32 to the photo-sensitive material 16 to always remain constant irrespective of the position of the light source 24. Moreover, the speed of movement of the light source 24 is determined by the copying magnification ratio, as is the position of the lens unit 28.

Directly above the photo-sensitive material conveyor path between the exposure part 20 and the photo-sensitive material magazine 14 is disposed an auxiliary, or secondary exposure means. As indicated in detail in FIG. 6, this auxiliary exposure means comprises an auxiliary exposure light source 21, a slit aperture 23 and an ND filter 25. The auxiliary exposure light source 21 comprises a halogen lamp that produces, or emits, a white light. The amount of white light produced by this auxiliary exposure light source 21 is restricted to a predetermined value by the slit aperture 23 and the ND filter 25, and the light is then illuminated to the photo-sensitive material 16. The degree of illumination by the auxiliary exposure is determined so that it is about 1/10 to 1/100 (or preferably 1/20 to 1/50) the degree of illumination by the main exposure light. As is described later, the photo-sensitive material 16 is exposed by the predetermined amount of light and then the image is exposed by the exposure part 20.

Furthermore, the auxiliary exposure light source 21 can be switched on and off, and the degree of constriction of the slit aperture 23 and the number of sheets of ND filter 25 used can be changed to vary the amount of light illuminated to the photo-sensitive material 16.

Downstream from the exposure part 20 is disposed a reversing roller 34 and on the other side of this reversing roller 34 is disposed a water applying part 36. The photo-sensitive material 16 upon which an image has been exposed by the exposure part 20 is conveyed by the reversing roller 4 and reversed, and has water applied as the image forming solvent, by the water applying part 36.

At the discharge end of the water applying part 36 are disposed squeeze rollers 37 to remove excess water applied to the photo-sensitive material 16.

Downstream from the squeeze rollers 37 is disposed a heat-developable transfer device provided with a heat-developable transfer part 38. The heat-developable transfer part 38 comprises a heating drum 40 and a endless pressure belt 42.

The surface of the heating drum 40 is coated with Teflon (trade name of the du Pont company) coating. Furthermore, inside the heating drum 40 is disposed a halogen lamp that heats the external surface of the heating drum 40 to approximately 90° C.

The endless pressure belt 42 is covered with a silicon rubber including carbon containing fatty-acid polyamide fibers (such as Kevlar or Nomex; both trade names of the du Pont company) as a heat-resisting material, and having conductivity.

In a portion of the base 12 opposite the photo-sensitive material magazine 14 of the base it is disposed a image-receiving material magazine 46. Inside this image-receiving material magazine 46 is stored a roll of image receiving material 48. The image-forming surface of the image receiving material 48 has applied to it a color fixing material containing a dyeing agent.

A cutter 50 is disposed at the discharge end of this image-receiving material magazine 46 and this cutter 50 cuts the image receiving material 48 drawn out from the image-receiving material magazine 46, to a predetermined length. The cut image receiving material 48 is sent to the heat-developable transfer part 38.

Near the heating drum 40 upstream in the direction of material feed of the endless pressure belt 42, is disposed a superposing, or affixing, roller 52. The affixing roller 52 superposes, or affixes, the conveyed photo-sensitive material 16 and image receiving material 48 to each other and presses them against the heating drum 40 so that they are guided and fed between the heating drum 40 and the endless pressure belt 42.

The photos-sensitive material 16 to which an image has been exposed, is superposed to the image receiving material 48 by the superposing roller 52 and fed in the affixed, or superposed, state around the heating drum 40, so that the image is heat-developed in the approximately two-thirds of a revolution for which the photo-sensitive material 16 and the image receiving material 48 are guided in the superposed state between the endless pressure belt 42 and the heating drum 40.

Furthermore, in the heat-developable transfer part 38 i.e., between the endless pressure belt 42 and the heating drum 40, heating the photo-sensitive material 16 and the image receiving material 48 in the state where they are affixed, releases the fluid coloring and at the same time transfers a color fixing layer to the iamge receiving material 48 to produce the image.

When this occurs, the endless pressure belt 42 is conductive and therefore charging due to static electricity generating because of friction between the heating drum 40 and the endless pressure belt 42, and the photo-sensitive material 16 and the image receiving material 48, is prevented.

On the lower part of the heating drum 40 downstream in the direction of supply of the material by the endless pressure belt 42, are provided separation fingers 56. Furthermore, between these separation fingers 56 and the endless pressure belt 42 is provided a separation roller 58.

The separation fingers 56 are always in a state of contact with the heating drum 40 and when the photo-sensitive material 16 is fed, receive the end of the photo-sensitive material 16 and separate the photo-sensitive material 16 from the iamge receiving material 48 and peel it from the external surface of the heating drum 40. Moreover, the separation roller 58 presses the photo-sensitive material 16 against the heating drum 40 and at the same time guides the photo-sensitive material 16 that has been separated by the separation fingers 56, downwards. The separated photo-sensitive material 16 is sent to a waste photo-sensitive material recovery box 60 provided beneath the heating drum 40.

Above the separation fingers 56 and near the heating drum 40 are provided a separation roller 62 and separation fingers 64, which separate the image receiving material 48 moving around the surface of the heating drum 40, after it has been separated from the photo-sensitive material 16, and peel it from the external surface of the heating drum 40. The iamge receiving material 48 that has been peeled from the external surface of the heating drum 40 is collected in a tray 66.

Moreover, as will be described later, a detector 78 detects the light reflected from the original during prescanning, and is used to determine the density of the image.

The following explanation is the operation of a first embodiment of the present invention.

The photo-sensitive material 16 drawn out from the photo-sensitive material magazine 14 is cut by the cutter 18 and conveyed to the exposure part 20.

The exposure device 22 is then operated, and while the light source 24 and the movable mirrors 27A and 27B are being moved, the original 32 laid upon the platen 30 is illuminated along its length, and the image light reflected by the original 32 is projected on to the photo-sensitive material passing through the exposure part 20 by the lens unit 28, so that a scanning exposure is conducted.

The auxiliary exposure light source 21 is operated immediately before the exposure part 20 and the light produced by the auxiliary exposure light source 21 is directly illuminated to the photo-sensitive material 16.

In this embodiment, the illumination of the original 32 by the light source 24 decreases the amount of light reflected from those parts of the original that have a high color density, and increases the amount of light reflected from those parts of the original that have a low color density. The color of the obtained image will have low density for those parts exposed with a large amount of light, and high density for those parts exposed with a small amount of light, and so when an image is exposed to the photo-sensitive material 16 that already has had a certain amount of auxiliary exposure, the parts exposed to much light, that is, the parts corresponding to the low density portions of the original, will have a relatively smaller ratio of auxiliary exposure to the total exposure, and so the lowering of the color density will only be slight. On the other hand, the parts exposed to little light, that is, the parts corresponding to the high densiyt portions of the original, will have a relatively greater ratio of auxiliary exposure to the total exposure, and so the lowering of the color density will only be great. The implementation of auxiliary exposure in this manner enables the density of the high-density portions of the image to be lower than if no auxiliary exposure was performed. In other words, the $\gamma$ value can be lowered.

Accordingly, by controlling the amount of auxiliary exposure to be in accordance with the gradaition of the image of the original 32, the characteristics of the photo-sensitive material 16 can be set to correspond to the gradation of the original iamge 32, and favorable exposure in accordance with the gradation of the original image 32 can be obtained.

For example, in the case of originals such as printed originals and text originals having a hard gradation characteristic in that the density of the image is intermittent (i.e. a high $\gamma$ value), deactivating the auxiliary exposure light source 21 or closing the slit aperture 23, or increasing the number of ND filters 25 can reduce the amount of light illuminated to the photo-sensitive material 16 so that a favorable exposure status is obtained. The above-described restrictign of the slit aperture 23 and icnreasing the number of ND filters 25 can both be performed at the same time. Furthermore, in the case of photographs having a soft density scale in that the density of the image is continuous (i.e. a low $\gamma$ value), activating the auxiliary exposure light source 21 or opening the slit aperture 23, or decreasing the number of ND filters 25 can increase the amount of light illuminated to the photo-sensitive material 16 so that a favorable exposure status is obtained. The above-described opening of the slit aperture 23 and decreasing the number of ND filters 25 can both be performed at the same time.

However, it is not necessary to use both the slit aperture 23 and the ND filters 25, as a configuration can also use only a slit aperture 23 or ND filters 25. Moreover, the auxiliary exposure light source 21 need not necessarily be a halogen lamp, as a white incandescent lamp can also be used.

After exposure, the photo-sensitive material 16 is reversed and conveyed by the reversing roller 34, and water applied as the image forming solvnet, by the water applying part 36, and is then conveyed to the heat-developable transfer part 38 after excess water has been removed by the squeeze rollers 37.

The image receiving material 48 is also sent in the direction of the heat-developable transfer part 38 because it is drawn out from the image-receiving material magazine 46 and cut to the predetermined length by the cutter 50 and then affixed to the photo-sensitive material 16.

At the entrance side to the heat-developable transfer part 38 is disposed the superposing roller 52 near the heating drum 40 on the upstream side of the direction of supply of the material by the endless pressure belt 42, and the photo-sensitive material 16 and the image receiving material 48 are supplied to this superposing roller 52.

The photo-sensitive material 16 and image receiving material 48 supplied to the superposing roller 52, are uniformly affixed by the superposing roller 52, and guided and fed between the heating drum 40 and the endless pressure belt 42.

Furthermore, in the heat-developable transfer part 38 (i.e. between the endless pressure belt 42 and the heating drum 40), heating and developing the photo-sensitive material 16 and the image receiving material 48 in the state where they are affixed, releases the fluid coloring, or dye, and at the same time transfers it to the color fixing layer of the image receiving material 48 to produce the image.

When this occurs, the endless pressure belt 42 is conductive and therefore charging due to static electricity generating because of friction between the heating drum 40 and the endless pressure belt 42, and the photo-sensitive material 16 and the image receiving material 48, is prevented so that spark discharge does not occur. Therefore, fog is prevented from occurring on the image obtained on the image receiving material 48.

When the photo-sensitive material 16 and the image receiving material 48 are held and conveyed to reach the lower part of the heating drum 40, the fingers 56 receive the end of the photo-sensitive material 16 and separate the photo-sensitive material 16 from the image receiving material 48 and peel it from the external surface of the heated drum 40 and at the same time, the separation roller 58 presses the photo-sensitive material 16 against the heating drum 40 and guides the photo-sensitive material 16 that has been separated by the separation fingers 56, downwards.

The separation photo-sensitive material 16 is sent to the waste photo-sensitive material recovery box 60 provided beneath the heating drum 40.

On the other hand, the image receiving material 48 moved together with the surface of the heating drum 40, after it has been separated from the photo-sensitive material 16, is separated from the heating drum 40 by the separation fingers 64 and the separation roller 62, peeled from the external surface of the heating drum 40, and collected in a tray 66.

Furthermore, in this embodiment, the auxiliary exposure light, source 21 together with the slit aperture 23 and the ND filters 25, is disposed between the exposure part 20 and the photo-sensitive material magazine 14 so that it is on the upstream side of the exposure part 20 with respect to the direction of conveyance of the photo-sensitive material 16, but can also be configured so that it is on the downstream side of the exposure part 20 with respect to the direction of conveyance of the photo-sensitive material 16, so that the auxiliary exposure is made after the image of the original 32 has been exposed by the light source 24 of the auxiliary exposure light source 21. This is to say that either the auxiliary exposure can be performed after the primary exposure, or the primary exposure can be performed after the auxiliary exposure.

Furthermore, the auxiliary exposure light source 21 can also be fixed in the proximity of the fixed mirrors 26 inside the exposure device 22, and configured so that the light does not directly illuminate the original 32. In this case, the light produced by the auxiliary exposure light source 21 is illuminated on the photo-sensitive material 16 together with the light illuminated on the original 32 from the light source 24 and reflected by the original 32.

Moreover, in this embodiment of the invention, the photo-sensitive material 16 is exposed by the image light reflected from the original 32 but a configuration whereby a light-transparent type of original is used so that the image light passing through the original is used to expose the photo-sensitive material 16, can also be used.

The following explanation refers to a second embodiment of the present invention. Those parts of this second embodiment that are substantially the same as corresponding parts in the first embodiment are indicated with the same numerals, and the explanation for them is omitted.

Figure 2:
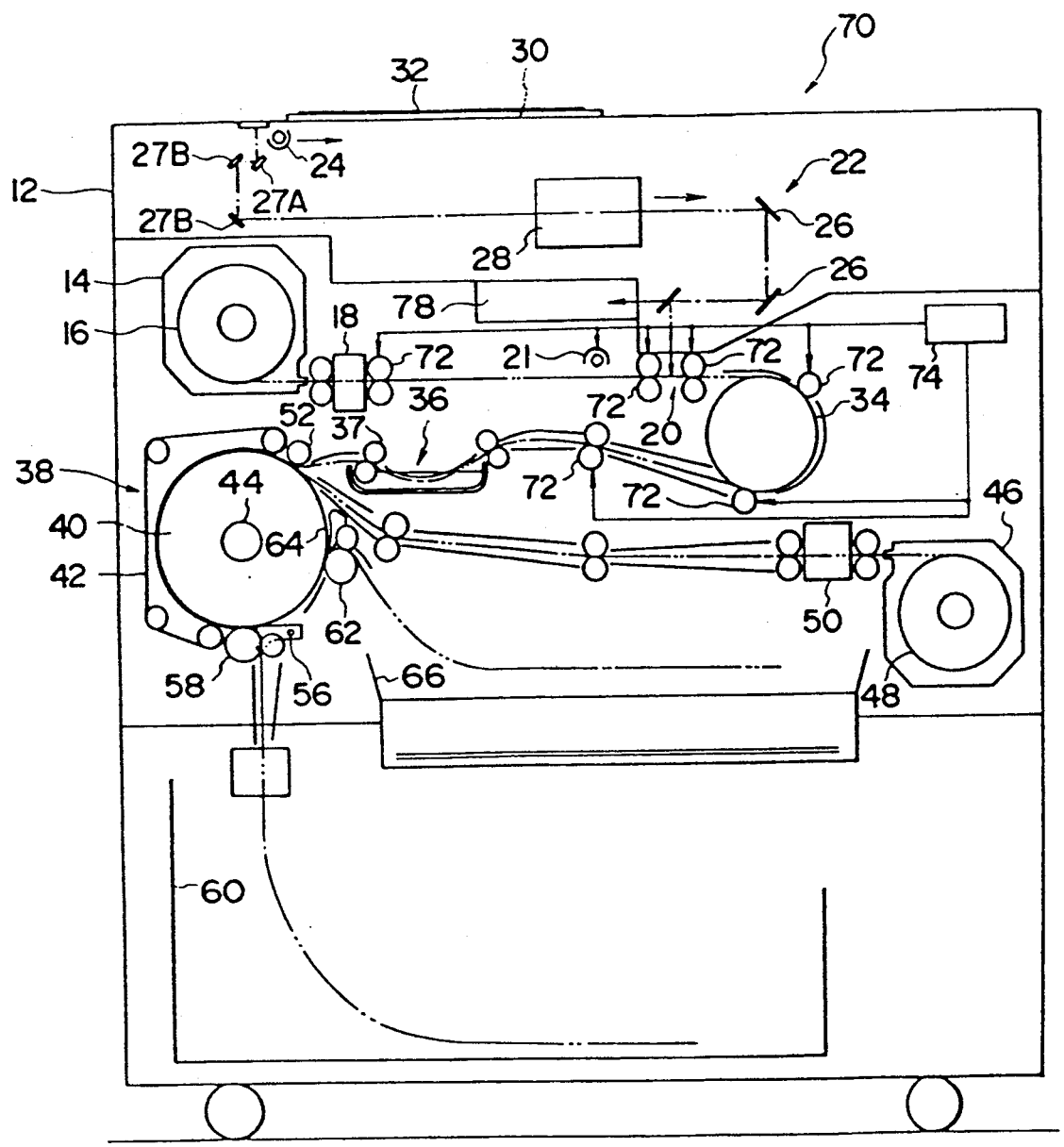
FIG. 2 is a schematic view of a second embodiment according to the present invention.

FIG. 2 is a schematic view of an image recording apparatus 70 according to a second embodiment of the present invention.

In the image recording apparatus 70, the auxiliary exposure means is the same as that of the first embodiment in that it is disposed above the photo-sensitive material conveyor part and between the primary exposure part 20 and image receiving material magazine 14, but differs in that slit aperture 23 and ND filters 25 are not disposed, and that only the auxiliary exposure light source 21 is disposed above the photo-sensitive material conveyor part.

Also, a plurality of conveyor rollers 72 for conveying the photo-sensitive material 16 disposed between the cutter 18 and the water applying part 36, are connected to a control circuit 74 as a means for controlling them. The auxiliary exposure light source 21 is connected to this control circuit 74. This control circuit 74 changes the speed of rotation of the conveyor rollers 72 so that the speed of conveyance of the photo-sensitive m;aterial 16 under the auxiliary exposure light source 21 can be changed. Accordingly, in this case, the change in the speed of conveyance can change the amount of auxiliary exposure time, that is to say, the amount of exposure by the auxiliary exposure light source 21.

In this embodiment, the photo-sensitive material 16 is cut to a predetermined length and then conveyed to the exposure part 20 by the conveyor rollers 72. While it is being conveyed, the exposure device 22 operates to illuminate light from the light source 24 to the original 32, and the image light reflected, is projected onto the photo-sensitive material 16 positioned in the exposure part 20 and scanning exposure (primary exposure) performed and the image recorded.

Furthermore, after the scanning exposure (primary exposure) of the image of the original 32 has been performed, the conveyor rollers 72 are reversed and the photo-sensitive material 16 is returned to the auxiliary exposure light source 21 side upstream with respect to the direction of conveyance. Then, the conveyor rollers 72 are once again driven to convey the photo-sensitive material 16, and auxiliary exposure light source 21 is operated to directly illuminate (secondary exposure) the photo-sensitive material 16. Because of this, the image of the original 32 is exposed on the photo-sensitive material 16, and, while the light component for image exposure is held as it is, only the amount of exposure changes In this embodiment, the conveyance speed of the photo-sensitive material 16 can be changed by the control circuit 74 so that after the main exposure for the image of the original 32, when light is again illuminated to the photo-sensitive material 16 (when the secondary exposure is performed), the control circuit 74 operates to change the conveyance speed of the conveyor rollers 72 in accordance with the gradation of the original 32 so that only the amount of exposure of the photo-sensitive material 16 (the exposure time of the auxiliary exposure) is changed, so as to set the photo-sensitive material 16 characteristics to a status corresponding to the gradation of the original image. For example, the conveyor speed is made faster for printed originals or text originals in which the density of the original image is intermittent, that for photograph originals in which the density of the original iamge is continuous.

In this embodiment a favourable exposure can be conducted so as to match the iamge of the original 32.

Furthermore, this embodiment of the present invention does not require a slit aperture and ND filters and therefore has the advantages of fewer parts and of less internal space being required.

Moreover, in this embodiment, the auxiliary exposure light source 21 is disposed between the exposure part 20 and the image receiving material magazine 14 so that it is on the upstream side of the exposure part 20 with respect to the direction of conveyance of the photo-sensitive material 16, but can also be configured so that it is on the downstream side of the exposure part 20 with respect to the direction of conveyance of the photo-sensitive material 16.

Furthermore, in this embodiment of the prevent invention, the auxiliary exposure is performed by the auxiliary exposure light source 21 after the exposure (primary exposure) of the image of the original 32 by the light source 24, but the auxiliary exposure can also be performed by the auxiliary exposure light source 21 prior to the exposure (primary exposure) of the image of the original 32 by the light source 24.

Still furthermore, in this embodiment as well, a configuration whereby a light-transparent type of original is used so that the image light passing through the original is used to expose the photo-sensitive material 16, can also be used.

Figure 3:
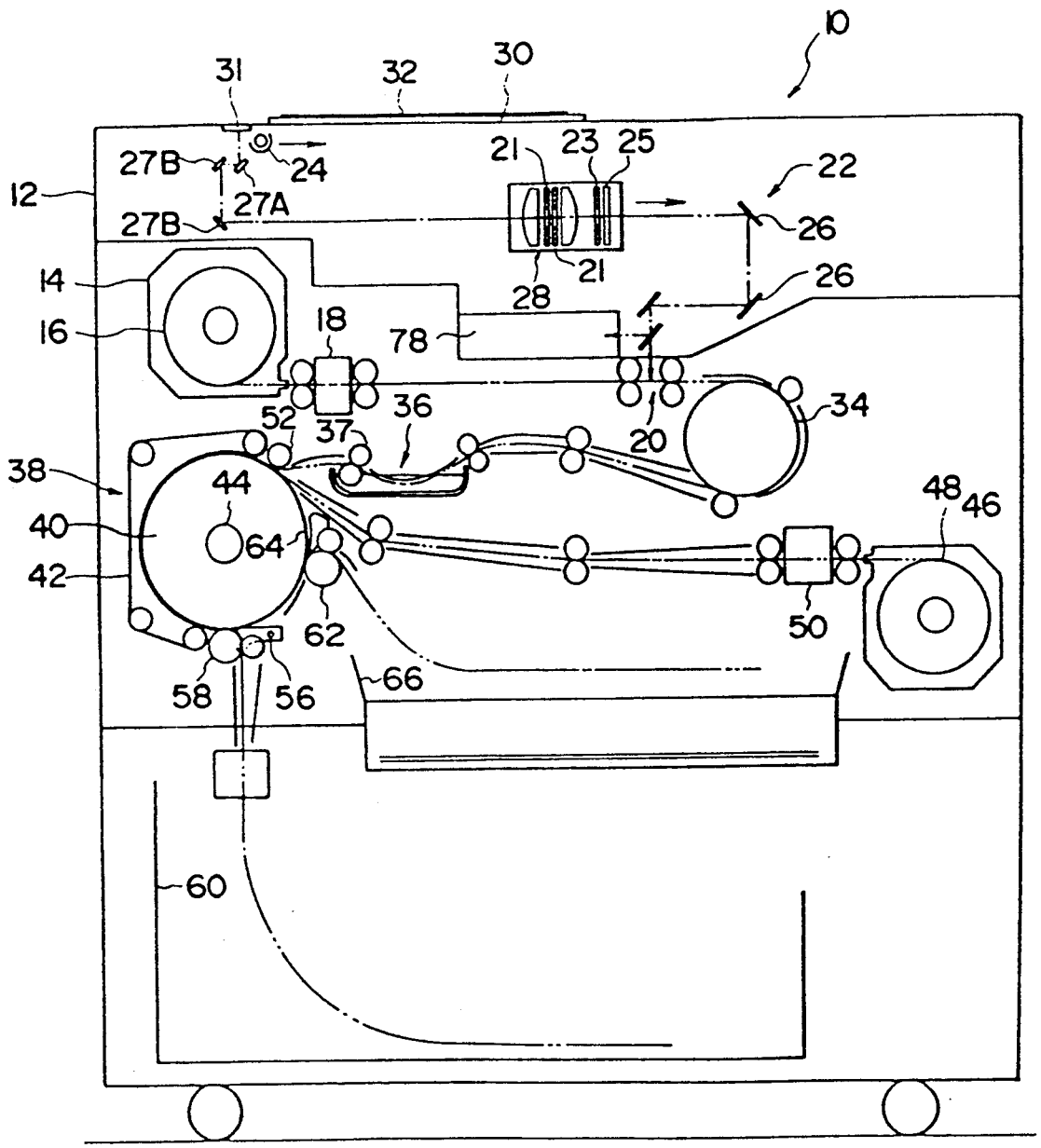
FIG. 3 is a schematic view of a third embodiment according to the present invention.

The following explanation refers to a third embodiment of the present invention. Those parts of this FIG. 3 that are substantially the same as corresponding parts in the FIG. 1 are indicated with the same numerals, and the explanation for them is omitted. In FIG. 3, the auxiliary exposure means of FIG. 1 comprising the secondary exposure light source 21, the ND filters 25 and the slit aperture 23 has been omitted, and in its place an auxiliary exposure means as described below is used.

Along the platen 30 at the top of the base 12 is disposed a white light reflector plate 31 comprising the auxiliary exposure means. The white light reflector plate 31 is disposed directly above one end of the path of movement of the light source 24, and so that the light source 24 can illuminate light only to the white light reflector plate 31 when the white light reflector plate 31 it is disposed above one end of this path of movement. When the white light reflector plate 31 is illuminated by the light from the light source 24, this light is reflected in a direction whereby it does not illuminate the original 32 placed on the platen 30, and passes through a lens unit 28 to illuminate the photo-sensitive material 16 (in what is hereinafter termed the auxiliary exposure). Moreover, the primary exposure to expose the image of the original 32 to the photo-sensitive material 16 is performed by moving the light source 24 as has been described above.

Inside the lens unit 28 are disposed CC filters 21 as a color compensation means, whereby adjusting the color balance of the primary exposure and the color balance of the auxiliary exposure in accordance with the characteristics of the photo-sensitive material 16 performs color compensation for the color balance of the image.

Furthermore, inside the lens unit 28 are disposed a slit aperture 23 and a ND filter 25 as the light amount adjustment means. A drive device (not indicated in the FIGURE) to adjust the degree of opening of the slit is provided for the slit aperture 23, and a drive device (not indicated in the FIGURE) to insert and remove the ND filters 25 from the optical path is also provided for the ND filter 25. The slit aperture 23 and the ND filters 25 can be adjusted so that the degree of illumination of the light reflected to illuminate the photo-sensitive material 16 when there is auxiliary exposure, is 1/10 to 1/100 (or preferably 1/20 to 1/50) that of the degree of illumination when there is primary exposure. Still furthermore, as will be described hereinafter, the photo-sensitive material 16 has the image exposed by the primary exposure and is then re-exposed to a predetermined amount of light by the auxiliary exposure.

The following is an explanation of the operation of this third embodiment of the present invention.

The photo-sensitive material 16 drawn out from the photo-sensitive material magazine 14 is cut by the cutter 18 and conveyed to the exposure part 20.

At the time when the leading end of the photo-sensitive material 16 reaches the exposure part 20, the exposure device 22 operates, and while the light source 24 and the movable mirrors 27A and 27B are moving, the original 32 laid upon the platen 30 is illuminated along its length and the image light reflected from the original 32 is projected through the lens unit 28 onto the photo-sensitive material 16 passing through the exposure part 20, thereby to produce a scanning exposure (primary exposure) to the photo-sensitive material 16.

When this occurs, the CC filters 21 disposed inside the lens unit 28 are adjusted in accordance with the color temperature of the light source 24 and the color balance and other characteristics of the photo-sensitive material 6, by the drive device (not indicated in the FIGURE), so that the CC filters 21 perform color compensation for the image exposed to the photo-sensitive material 16.

Then, the light source 24, movable mirrors 27A and 27B and lens unit 28 move in the opposite direction so that the light source 24 is positioned immediately below the white light reflector plate 31 disposed on the side of the platen 30. At the same time, the photo-sensitive material 16 is also conveyed in this opposite direction so that it passes the exposure part 20 once again.

Here, the light source 24 operates once again and light is illuminated to only the white light reflector plate 31, and the photo-sensitive material 16 is passed through the exposure part 20.

The white light reflector plate 31 reflects the illuminated light so that none is illuminated to the original 32 placed on the platen 30. The reflected white light is adjusted by the slit aperture 23 and the ND filter 25 of the lens unit 28 so that the degree of illumination is 1/10 to 1/100 (or preferably 1/20 to 1/50) that of the degree of illumination when there is primary exposure, and passes through the CC filter 21 to illuminate the photo-sensitive material 16 (auxiliary exposure). Therefore, the photo-sensitive material 16 has an increased amount of exposure for along the entire length of the visible spectrum.

Accordingly, by controlling the amount of auxiliary exposure to be in accordance with the gradation of the image of the original 32, the characteristics of the photo-sensitve material 16 can be set to correspond to the gradation of the original image 32, and a favorable exposure in accordance with the gradation of the original image 32 can be obtained.

For example, in the case of originals such as printed originals and text originals having a hard density scale in that the density of the image is intermittent, i.e. having a high γ value, deactivating the auxiliary exposure light source 21 or closing the slit aperture 23, or inserting the ND filter 25 in the optical path can reduce the amount of light illuminated to the photo-sensitive material 16 so that a favorable exposure status is obtained. Furthermore, in the case of photographs having a soft density scale in that the density of the image is continuous, i.e., having a low γ-characteristic, activating the auxiliary exposure light source 21 or opening the slit aperture 23, or removing the ND filter 25 from the optical path can increase the amount of light illuminated to the photo-sensitive material 16 so that a favorable exposure status is obtained. In this description, a combination of the slit aperture 23 and the ND filter 25 is used together but it is not necessary to use both the slit aperture 23 and the ND filter 25, as a configuration can also use only the slit aperture 23 or the ND filters 25.

Still furthermore, during the auxiliary exposure, the CC filter 21 disposed inside the lens unit 28 differs from its action during the primary exposure, in that it adjusts to perform compensation for differences in the γ-characteristic of the photo-sensitive material 16, and the CC filter 21 performs independent color compensation each time an image is exposed to photo-sensitive material 16. Accordingly, it is possible to re-perform color compensation that was inadequate at the time of primary exposure, so that an exposure having good balance for all densities can be obtained.

Moreover, in this embodiment, the amount of exposure of the photo-sensitive material 16 when there is auxiliary exposure, that it, the amount of light reflected by the white light reflector plate 31, can be adjusted by the slit aperture 23 and the ND filter 25 disposed in the lens unit 28, but instead of this configuration, one whereby the operating voltage of the light source 24 can be varied to adjust the amount of light produced by the light source 24 can also be used.

Furthermore, instead of the white light reflector plate 31 and the ND filter 25, a gray-colored plate having a low index of refractivity can be disposed in a configuration whereby the amount of exposure in the auxiliary exposure is adjusted by this gray-colored plate being exchanged suitably. In this case, high-priced parts are unnecessary and the structure is also simplified. Still furthermore, the use of the gray-colored plate is more effective if a cooling fan is provided. It is also possible to use the gray-colored plate and a slit aperture 23 in combination.

The following explanation refers to a fourth embodiment of the present invention. Those parts of this fourth embodiment that are substantially the same as corresponding parts in the third embodiment are indicated with the same numerals, and the explanation for them is omitted.

Figure 4:
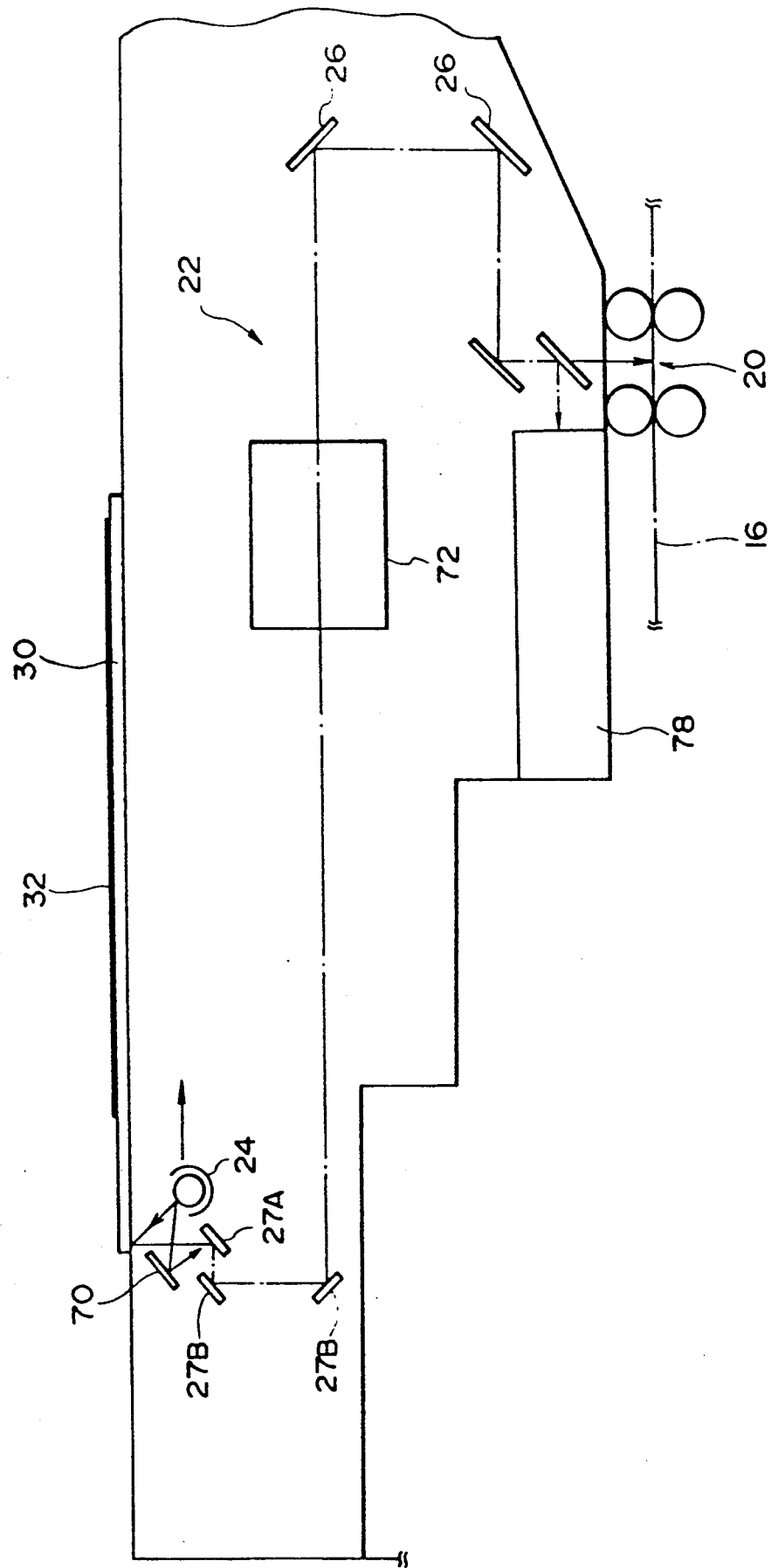
FIG. 4 is a schematic view of a fourth embodiment according to the present invention.

As indicated in FIG. 4, a reflector plate 70 to perform auxiliary exposure is disposed on the side of the platen 30. The reflector plate 70 has a dispersal surface so that when light is produced by the light source 24, that light is reflected in the direction of the movable mirror 27A and passes through the lens unit 72 to be illuminated onto the photo-sensitive material 16. This reflector plate 70 is configured so that its speed of movement is the same as the speed of movement of the light source 24 and the movable mirror 27A. In this case, the degree of illumination of the light reflected by the reflector plate 70 is the same as in the described earlier for the first embodiment, in that it is adjusted so that it is about 1/10 to 1/100 (or preferably κ to 1/50) the degree of illumination of the light directly illuminated to the original 32 from the light source 24.

Accordingly, in this embodiment, the light produced by the light source 24 and illuminated to the original 32 is either reflected by or passes the surface of the original 32 and is illuminated to the photo-sensitive material 16, so that the image of the original 32 is exposed to the photo-sensitive material 16 and at the same time, part of the light produced by the light source 24 is reflected by the reflector plate 70 without illuminating the original 32, so that it is illuminated to the photo-sensitive material 16 along with the reflected light which has been illuminated on the original 32 and reflected therefrom. This is to say, the primary exposure and the auxiliary exposure are performed simultaneously.

The auxiliary exposure by this reflector plate 70 does not change the components of the light for the exposure of the image of the original 32, and only the amount of exposure of the photo-sensitive material 16 is changed.

Accordingly, by suitable use of the reflector plate 70 in accordance with the gradation of the original image, the characteristics of the photo-sensitive material 16 can be set for a single exposure operation, and favorable exposure in accordance with the original image can be performed. Furthermore, since the primary exposure and the auxiliary exposure are performed simultaneously, less time is required to record an image.

Moreover, as in the previously described embodiment, a slit aperture 23 and ND filters 25 are disposed between the reflector plate 70 and the movable mirrors 27A and 27B, so that the amount of light reflected by the reflector plate 70 can be adjusted.

Furthermore, in the previously described embodiments, a configuration whereby light is lluminated onto the original 32 and the reflected light used to expose the photo-sensitive material 16 was used but a configuration whereby a transparent-type original is used and the light passing through the original used to expose the photo-sensitive material 16, can also be used.

As has been described above, according to the third and fourth embodiments of the present invention, illuminating the original and illuminating the photo-sensitive material by the light from the light source of the auxiliary exposure means and without illuminating the original, are performed together so that the light reflected from (or passing through) the original illuminates the photo-sensitive material by an amount in accordance with the density of the original, and exposing the photo-sensitive material with a certain amount of light that has neither been reflected by or passed through the original increases the total exposure by this certain amount in accordance with the density of the original. Because of this, the ratio of the amounts of exposure between two points on the photo-sensitive material with respect to two points on the original and having different densities, becomes smaller in the case where there is no exposure (secondary exposure) by a certain amount of light that has neither been reflected by or passed through the original. This is to say, the γ-characteristic of the photo-sensitive material has a smaller value for γ (a softer characteristic). Because of this, operating the secondary exposure means in accordance with the gradation of the original iamge, and therefore perform favorable exposure for the image of the original.

Still furthermore, the light illuminated onto the photo-sensitive material by the auxiliary exposure means performs independent color compensation. Because of this, the characteristics of the photo-sensitive material are set to a status corresponding to the gradation of the original image, and a favorable exposure of the image of the original can be performed and at the same time, even when the color characteristics of the three color elements (for example, cyan, magenta, yellow) of the photo-sensitive material are different, exposing while suitably inserting color compensation filers enables an image having a suitable color balance to be obtained.

The following explanation refers to a fifth embodiment of the present invention. In this embodiment, it is automatically judged whether or not auxiliary exposure is necessary, and if necessary, the amount of auxiliary exposure is automatically set. Those parts of this fifth embodiment that are substantially the same as corresponding parts in the first embodiment are indicated with the same numerals, and the explanation for them is omitted.

Figure 5:
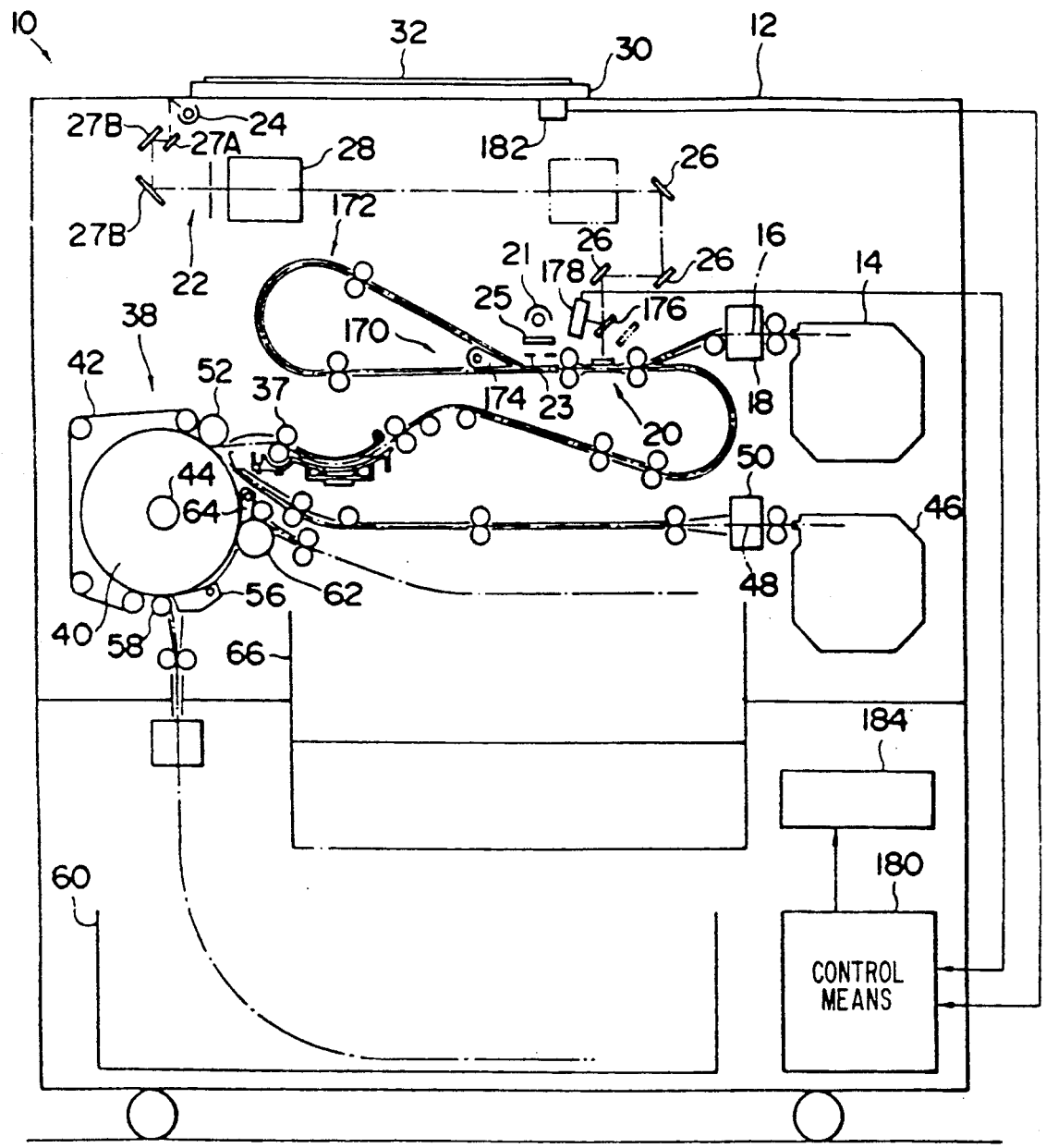
FIG. 5 is a schematic view of a fifth embodiment according to the present invention.

As is indicated in FIG. 5, downstream from the exposure part 20 (the left side of FIG. 5) is disposed a branch part 170 and a reversal part 172.

The branch part 170 has a flapper 174 rotatably disposed, the purpose of this flapper 174 is to change the conveyor path to either one or the other branches of the photo-sensitive material 16 conveyor path, so that the photo-sensitive material 16 is conveyed along the selected branch of the conveyor path. Moreover, the photo-sensitive material 16 is guided to the conveyor path at the top of FIG. 5 immediately after the photo-sensitive material 16 has been drawn out of the photo-sensitive material magazine 14. The guided photo-sensitive material 16 is reversed in the reversal part 172 and conveyed to the exposure part 20 once again. By doing this, the photo-sensitive surface of the photo-sensitive material 16 is made to face upwards (towards the top of FIG. 5).

Here, when the photo-sensitive material 16 is exposed, and while the light source 24 and the first movable mirror 27A are being moved, the second movable mirrors 27B is moved at one-half the speed of the first movable mirror 27A so as to follow it and so as to illuminate the light to the original 32. The light reflected from the original 32 is illuminated on the photo-sensitive material 16 passing through the exposure part 20 by the lens unit 28 to perform a scanning exposure to the photo-sensitive material 16. Moreover, by changing the speed of movement of the first movable mirrors 27A and the position of the lens unit 28, it is possible to change the ratio of copying magnification of the image to the photo-sensitive material 16. In this embodiment, full-size copy of the image is achieved by having the speed of movement of the movable mirror 27A equal to the conveyor speed of the photo-sensitive material 16.

Disposed beneath the fixed mirrors 26 in FIG. 5, is a sliding mirror 176 along the optical path from the fixed mirrors 26 to the photo-sensitive material 16. The sliding mirror 176 operates as a shutter so that it is removed (shown dotted in FIG. 5) from the optical path when there is the previously described scanning exposure. Moreover, during the prescanning prior to the previously described scanning exposure, the light from the fixed mirrors 26 is reflected at approximately 90° and is guided to the photo detector 78. This photo detector 178 can measure the density of the original image, and is connected to the control means 180.

At this stage, originals applicable to the image recording device 10 of this embodiment of the invention are given a mark specifying the type of original beforehand. This mark is for example, a bar code, a character or a symbol, and is made so that the operator can perform visual identification of the original. A mark detector 182 is provided to detect these marks (such as A, B, C, D,,,) marked on the original 32 on the platen 30. The mark detector 182 is connected to the control means 180.

Figure 7:
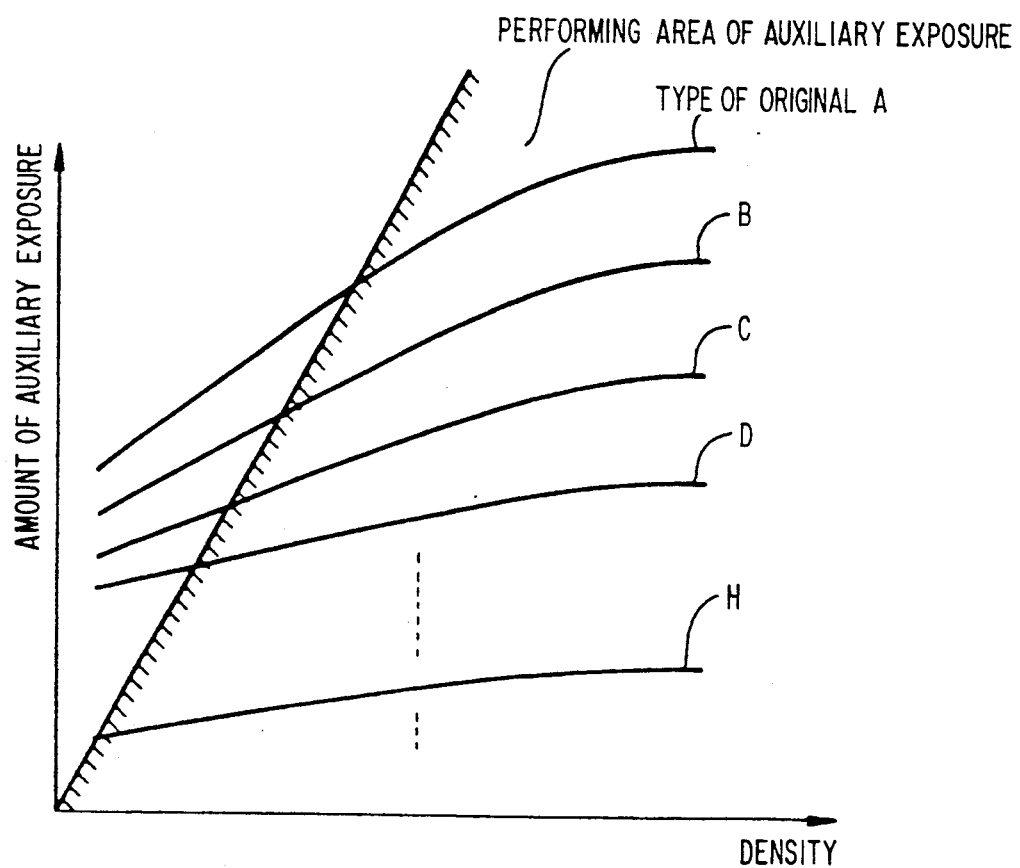
FIG. 7 is a graph showing the relationship between the amount of auxiliary exposure and the density, for various types of originals in the fifth embodiment of the present invention.

The memory of the control means 180 stores a map indicating the previously described density, the type of original, the amount of auxiliary exposure and its characteristics (Refer to FIG. 7). In the control means 180, the density of the original 32 is measured by the prescanning, the type of original is detected by the mark detector and a judgment made for whether or not auxiliary exposure is necessary, and if so, the amount of auxiliary exposure is set. Moreover, the control means 80 is connected to a display means 184 that displays whether or not auxiliary exposure is necessary, and if necessary, the amount.

Figure 6:
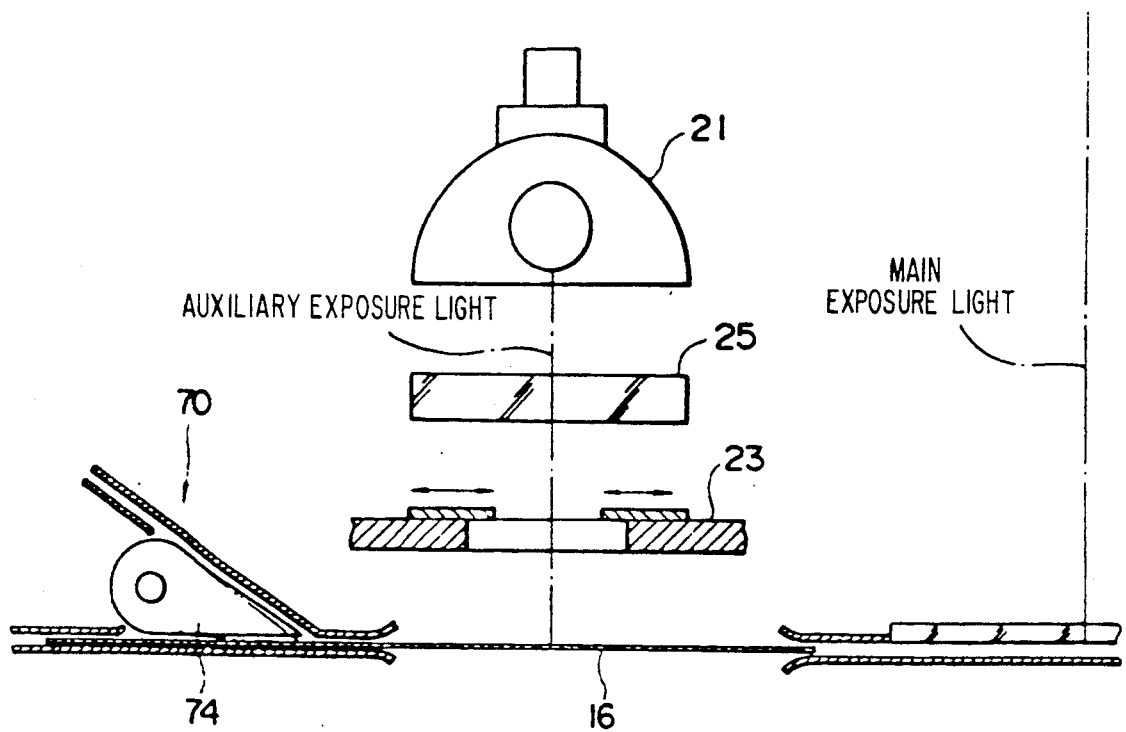
FIG. 6 is an enlarged view of an auxiliary exposure portion and its peripheral parts, of the fifth embodiment of the present invention.

As indicated in FIG. 6, directly above the photosensitive material convey or parth and between the exposure part 20 and the branch part 170 is disposed an auxiliary exposure light source 21 together with a slit aperture 23 and an ND filter 25. The auxiliary exposure light source 21 comprises a halogen lamp or an incandescent lamp that produces a white light and the amount of white light produced by this auxiliary exposure light source 21 is restricted to a predetermined value by the slit aperture 23 and the ND filter 25, and the light is then illuminated to the photo-sensitive material 16. The degree of illumination by the auxiliary exposure is determined so that it is about 1/10 to 1/100 (or preferably $\frac{1}{2}$ to 1/50) the degree of illumination by the main exposure light. Moreover, as is described later, the photo-sensitive material 16 is exposed by the predetermined amount of light and then the image is exposed by the exposure part 20.

Furthermore, the auxiliary exposure light source 21 can be switched on and off on the basis of the auxiliary exposure conditions set by the previously described control means 180, and the changing the amount of closing of the slit aperture 23 or changing the ND filter 25 enables the amount of auxiliary exposure light illuminated to the photo-sensitive material 16 to be changed.

Downstream from the exposure part 20 are provided a water applying part 36 and a heat-developable transfer part 38, as in the previously described embodiments of the invention.

The following is a description of the operation of this embodiment of the present invention.

The photo-sensitive material 16 drawn out from the photo-sensitive material magazine 14 is cut by the cutter 18 and conveyed to the exposure part 20. At the same time, the original 32 placed on the platen 30 is prescanned. When the prescanning is performed, the mark detector 182 detects the mark marked on the original 32 and supplies the results of detection to the control means 180. In the prescanning, the scanned light is sent along a path comprising the first movable mirror 27A, the second movable mirrors 27B, the fixed mirrors 26 and the sliding mirror 176 to be sent to the detector 178. At the detector 178, the density of the original iamge is detected by this light and supplied to the control means 180. At the control means 180, the type and density of the original are used to determine on the basis of the map in FIG. 7, whether or not auxiliary exposure is necessary and if so, the amount of auxiliary exposure. The following explanations refers to the case when auxiliary exposure has been determined necessary. If auxiliary exposure is determined necessary, this fact and the amount of auxiliary exposure are indicated by the display means 184, and the amount of closing of the slit aperture 23 is changed to correspond to the amount of auxiliary exposure determined necessary. Also, changes to the ND filter 25 is also displayed, in accordance with necessity.

The photo-sensitive material 16 is reversed by the reversal part 172 so that the exposable surface faces upwards, and is sent to the exposure part 20 for a second time. When the photo-sensitive material 16 reaches the exposure part 20, the exposure device 22 operates again and light is illuminated along the length of the original 32 placed on the platen 30 at the same time as the primary exposure light source 24 and the movable mirrors 27A and 27B are moving, and via the lens unit 28, the reflected light performs a scanning exposure (primary exposure) of the photo-senstiive material 16 positioned in the exposure part 20.

For the auxiliary exposure, the auxiliary exposure light source 21 before the exposure part 20 operates and the produced light directly illuminates the photo-sensitive material 16 (auxiliary exposure).

In this manner, the implementation of auxiliary exposure enables the density of the high-density portions of the image to be lower than if no auxiliary exposure was performed. In other words, the γ value can be lowered.

Accordingly, by operating the auxiliary exposure light source 21 in accordance with the gradation of the original image, the characteristics of the photo-sensitive material 16 can be set to correspond to the gradation of the original image 32, and a favorable exposure in accordance with the auxiliary of the original image 32 can be obtained.

However, it is not necessary to use both the slit aperture 23 and the ND filter 25, as a configuration can also use only the slit aperture 23 or the ND filter 25. Moreover, the auxiliary exposure light source 21 need not necessarily be halogen lamp, as a white incandescent lamp can also be used.

After exposure, the photo-senstiive material 16 is reversed and conveyed, water applied by the water applying part 36, and is then conveyed to the heat-developable transfer part 38 after excess water has been removed by the squeeze rollers 37.

The image receiving material 48 is also sent in the direction of the heat-developable transfer part 38 because it is drawn out from the image receiving material magazine 46 and cut to a predetermined length by cutter 50 and then superposed on the photo-sensitive material 16.

In the heat-developable transfer part 38, heat developing and transfer is performed in the same manner as in the previously described embodiments, and the image receiving material 48 is peeled from the heating drum 40 by the separation roller 62 and separation fingers 64 and collected in the tray 66.

Furthermore, in this embodiment, the auxiliary exposure light source 21 together with the slit aperture 23 and the ND filters 25 is disposed between the exposure part 20 and the branch part 170 so that it is on the downstream side of the exposure part 20 with respect to the direction of conveyance of the photo-sensitive material 16, but can also be configured so that it is on the upstream side of the exposure part 20 with respect to the direction of conveyance of the photo-sensitive material 16. Also, the light source 24 can be used to perform both primary exposure and auxiliary exposure simultaneously.

Furthermore, this embodiment of the invention is configured so that light is illuminated to the original 32 and then the photo-sensitive material 16 is exposed by the reflected image light but a configuration whereby a light-transparent type of original is used so that the image light passing through the original is used to expose the photo-sensitive material 16, can also be used.

Still furthermore, in this embodiment of the present invention the amount of auxiliary exposure is changed by the slit aperture 23 and the ND filter 25 but alternativley, it can be changed by varying the speed of conveyance of the photo-sensitive material 16.

Also, in this original determining means of this embodiment of the present invention, the mark detector is used to detect the mark marked on the original beforehand, but alternatively, an operator can input the type of original from a keyboard each time. Also, the image of the original can be read through a band pass filter and a device used to determine the type of original.

Moreover, the above description related to an embodiment where the mark marked on the original 32 is detected by a dark detector 182 but alternatively, as is described below, the type of original can be identified when prescanning is performed, from the density of the original.

Figure 8:
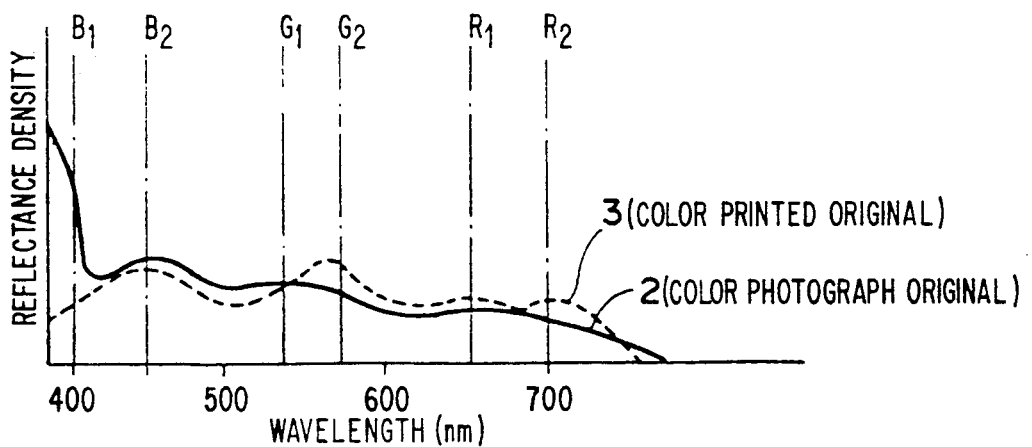
FIG. 8 is a graph showing the spectral reflectance density of a color photograph original and a color print original on which low-density color images have been recorded.

FIG. 8 shows the spectral reflectance density of a color photograph and a color printed matter where a low-density color image is recorded with an average spectral distribution. A density curve 2 indicated by the solid line is the density distribution of the color photograph and a density curve 3 indicated by the dotted line is the density distribution of the color printed matter.

Figure 9:
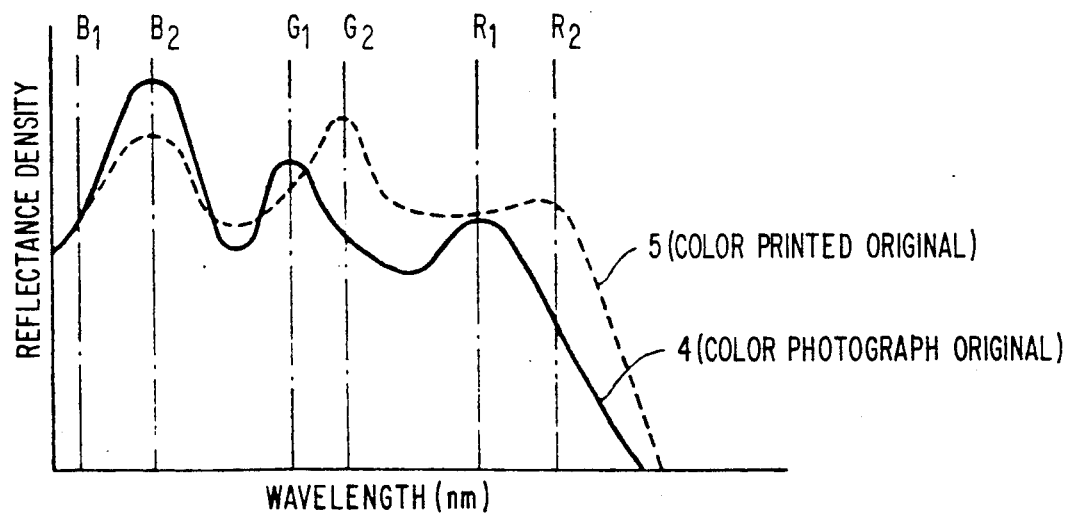
FIG. 9 is a graph showing the spectral reflectance density of a color photograph original and a color print original on which intermediate-density color images have been recorded.

FIG. 9 shows the spectral reflectance density of a color photograph and a color printed matter where a medium- to high-density color image is recorded with an average spectral distribution. A density curve 4 indicated by the solid line is the density distribution of the color photograph and a density curve 5 indicated by the dotted line is the density distribution of the color printed matter.

As can be understood from FIG. 8 and FIG. 9, in the case of the low-density color photograph, there is a fairly large difference in the density at approximately 400 nm and approximately 500 nm. This is because a medium with an extremely high density (extremely large absorption) at around 380 nm, is used and so the influence of this medium becomes larger at low densities. For the medium- and high-density color photograph, the degrees of the densities at 400 nm and 500 nm are reversed.

Also, the magenta color used in the color photographs has an extremely high density (extremely large absorption) at around 530-560 nm, while the cyan color has an extremely large density at around 650 nm. Nevertheless, the magenta and cyan colors have a characteristic large reduction in the density (absorption) on either side of these wavelengths.

In the case of the magenta ink used in the color printing, there is an extremely high density around 570 nm. Cyan ink has a roughly average density up until 600 to 700 nm but in the long wavelengths from 700 nm up, the reduction in the density is sharper than it is for cyan color.

Figure 10:
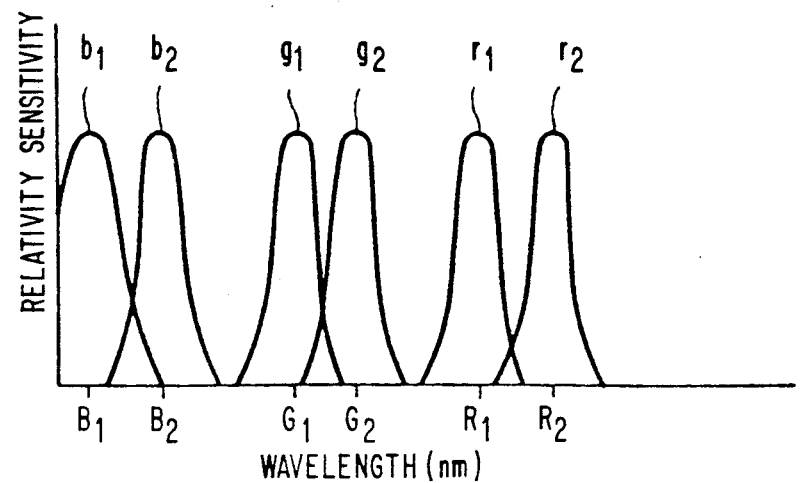
FIG. 10 is a graph showing the relative sensitivity of the sensor.

In this manner, the density distribution differs according to the type of color original and so the sensitivity characteristics indicated in FIG. 10 can be utilized so that a sensor can investigate the spectral strength or the reflectance density, and therefore determine the type of color original with good accuracy. In FIG. 10, the curve b1 indicates the sensitivity curve of a first blue sensor for measuring the primary color of blue, and there is a sensitivity peak at wavelength B1 (for example, 400±30 nm). Curve b2 indicates the sensitivity curve of a second blue sensor for measuring the primary color of blue, and there is a sensitivity peak at wavelength B2 (for example, 450±30 nm).

Curve g1 indicates the sensitivity curve of a first green sensor for measuring the primary color of green, and there is a sensitivity peak at wavelength G1 (for exmaple, 540±15 nm). Curve g2 indicates the sensitivity curve of a second green sensor for measuring the primary color of green, and there is a sensitivity peak at wavelength G2 (for example, 570±15 nm).

Curve r1 indicates the sensitivity curve of a first red sensor for measuring the primary color of red, and there is a 1sensitivity peak at wavelength R1 (for example, 630±40 nm). Curve r2 indicates the sensitivity curve of a second red sensor for measuring the primary color of red, and there is a sensitivity peak at wavelength R2 (for example, 680±40 nm).

As has been described above, the image recording device of this embodiment of the present invention provides the extremely advantageous effects of automatically determining the necessity for auxiliary exposure and if necessary, for automatically setting the auxiliary exposure amount.

What is claimed is:

1. An image recording apparatus for recording an image of an original to a photo-sensitive material having predetermined characteristics, comprising:

a means provided with a first source for performing primary exposure to expose said photo-sensitive material with an image of an original by the light illuminated from said first light source; and a means for performing auxiliary exposure to expose said photo-sensitive material by an amount of light corresponding to the type of said original.

2. An image recording apparatus according to claim 1, wherein said auxiliary exposure means is constituted to perform the auxiliary exposure before the main exposure has been performed.

3. An image recording apparatus according to claim 1, wherein said auxiliary exposure means is constituted to perform the auxiliary exposure after the main exposure has been performed.

4. An image recording apparatus according to claim 1, wherein said auxiliary exposure means is constituted to perform the auxiliary exposure simultaneously with the main exposure being performed.

5. An image recording apparatus according to claim 1, wherein the exposure amount corresponding to the type of original is made larger in the case of the original in which the density changes continuously than in the case of the original in which the density changes intermittently.

6. An image recording apparatus according to claim 5, wherein the exposure amount for the original in which the density changes intermittently is zero.

7. An image recording apparatus according to claim 1, wherein said auxiliary exposure means comprises a second light source,
   at least one ND filter disposed on the illuminating side of said second light source, and
   an aperture disposed on the transmitted light side of said ND filter.

8. An image recording apparatus according to claim 7, wherein said auxiliary exposure means is constituted to change the mount of auxiliary exposure either by varying the voltage supplied to said second light source, by changing the number of said ND filter used, or by adjusting the opening of said aperture.

9. An image recording apparatus according to claim 1, wherein said auxilliary exposure means is constituted to change the amount of auxiliary exposure either by changing the degree of illumination and/or by changing the time of the exposure to the photo-sensitive material.

10. An image recording apparatus according to claim 1, wherein said auxiliary exposure means is constituted to perform the auxiliary exposure using light illuminated from the first light source of the primary exposure means.

11. The image recording apparatus according to claim 1, further comprising means for conveying said photo-sensitive material and means for controlling the conveying speed of said conveying means so as to be capable of changing the conveying speed.

12. The image recording apparatus according to claim 1, wherein said auxiliary exposure means is provided with a means for performing color compensation for the light exposing the photo-sensitive material so as to correspond to the type of the original.

13. The image recording apparatus according to claim 12, wherein said auxiliary exposure means is provided with a means for performing light amount adjustment.

14. An image recording apparatus for recording an image of an original onto a photo-sensitive material having predetermined characteristics, comprising:
   means for conveying the photo-sensitive material;
   a means, provided with a first light source movable relative to the original, for performing primary exposure by projecting an image of the original onto the photo-sensitive material during the conveying of the photo-sensitive material by said conveying means, the original being illuminated by said first light source during the moving of said first light source;
   a means for performing auxiliary exposure of the photo-sensitive material with an exposure amount corresponding to the type of the original during the conveying of the photo-sensitive material by the conveying means; and
   a means for performing heat development and transfer of the image by superposing the photo-sensitive material on which the primary and auxiliary exposures have been performed and an image-receiving material on each other around the surface of a drum.

15. An image recording apparatus according to claim 14, wherein said auxiliary exposure means is constituted to perform the auxiliary exposure before the main exposure has been performed.

16. An image recording apparatus according to claim 14, wherein said auxiliary exposure means is constituted to perform the auxiliary exposure after the main exposure has been performed.

17. An image recording apparatus according to claim 14, wherein said auxiliary exposure means is constituted to perform the auxiliary exposure simultaneous with the main exposure being performed.

18. An image recording apparatus according to claim 14, wherein said auxiliary exposure means comprises a second light source,
   at least one ND filter disposed on the illuminating side of the second light source, and
   an aperture disposed on the transmitted light side of said ND filter.

19. An image recording apparatus according to claim 18, wherein said auxiliary exposure means is constituted to change the amount of the auxiliary exposure either by varying the voltage supplied to the second light source, by changing the number of said ND filter used, or by adjusting the opening of said aperture.

20. An image recording apparatus according to claim 14, further comprising means for controlling a conveying speed of said conveying means so as to be capable of changing the conveying speed.

21. An image recording apparatus according to claim 14, wherein said auxiliary exposure means is constituted to perform the auxiliary exposure using light illuminated from the first light source of said primary exposure means.

22. An image recording apparatus according to claim 14, wherein said auxiliary exposure means is provided with a means for performing color compensation for the light exposing the photo-sensitive material so as to correspond to the type of the original.

23. An image recording apparatus according to claim 14, wherein said auxiliary exposure means is provided with a means for performing light amount adjustment.

* * * * *